United States Patent [19]
Morris

[11] Patent Number: 5,386,533
[45] Date of Patent: Jan. 31, 1995

[54] METHOD AND APPARATUS FOR MAINTAINING VARIABLE DATA IN A NON-VOLATILE ELECTRONIC MEMORY DEVICE

[75] Inventor: John O. Morris, Houston, Tex.

[73] Assignee: Texas Instruments Incorporated, Dallas, Tex.

[21] Appl. No.: 616,521

[22] Filed: Nov. 21, 1990

[51] Int. Cl.[6] .............................................. G06F 12/02
[52] U.S. Cl. ..................... 395/425; 364/DIG. 1; 364/561; 364/244.5; 364/245.2; 377/24.1; 395/400
[58] Field of Search ... 364/200 MS File, 900 MS File, 364/561, 555; 395/400, 425; 377/24, 24.1, 24.2; 235/95

[56] References Cited

U.S. PATENT DOCUMENTS

| | | | |
|---|---|---|---|
| 3,953,720 | 4/1976 | Kelch | 377/24.1 |
| 4,682,287 | 7/1987 | Mizuno et al. | 364/561 |
| 4,710,888 | 12/1987 | Burke et al. | 364/561 |
| 4,803,646 | 2/1989 | Burke et al. | 235/95 R |
| 4,860,228 | 8/1989 | Carroll | 364/561 |
| 4,947,410 | 8/1990 | Lippmann et al. | 377/26 |
| 5,046,029 | 9/1991 | Ikeda | 364/561 |
| 5,095,452 | 3/1992 | Kanemaru | 364/561 |
| 5,103,411 | 4/1992 | Shida et al. | 364/561 |
| 5,105,449 | 4/1992 | Bennett et al. | 377/24.1 |

OTHER PUBLICATIONS

"Memory Protection for Odometers", A. E. Gore, The 5th International Conference on Automotive Electronics, IMECHE Conf. Pub. 1485-12.
"Electronic Odometer Uses Non-Volatile Memory", M. J. Burke et al., SAE paper 840319 (SP-565).

*Primary Examiner*—Joseph L. Dixon
*Assistant Examiner*—Hiep T. Nguyen
*Attorney, Agent, or Firm*—Ira S. Matsil; James F. Hollander; Richard L. Donaldson

[57] ABSTRACT

An apparatus and method for maintaining variable data in a non-volatile electronic memory device comprises a shifter array (106) which provides a shifter value to shifter register (104). Shifter register (104) uses 8-bit column decoder (110) to specify which of a plurality of overlapping storage units in array (94) will store variable data provided from register (92). Address register (112) specifies to row decoder (116) which of two rows in shifter array (106), pointer array (118) and array (94) will be accessed by read and write operations. Pointer array (118) stores an index specifying which of the two rows contains the most recently updated variable data. Shifter register (104) uses 8-bit column decoder (108) to specify which of a plurality of adjacent storage units in pointer array (118) will store the index. OR gate (98) specifies when to replace an overlapping storage unit in array (94) and an adjacent storage unit in pointer array (118).

67 Claims, 7 Drawing Sheets

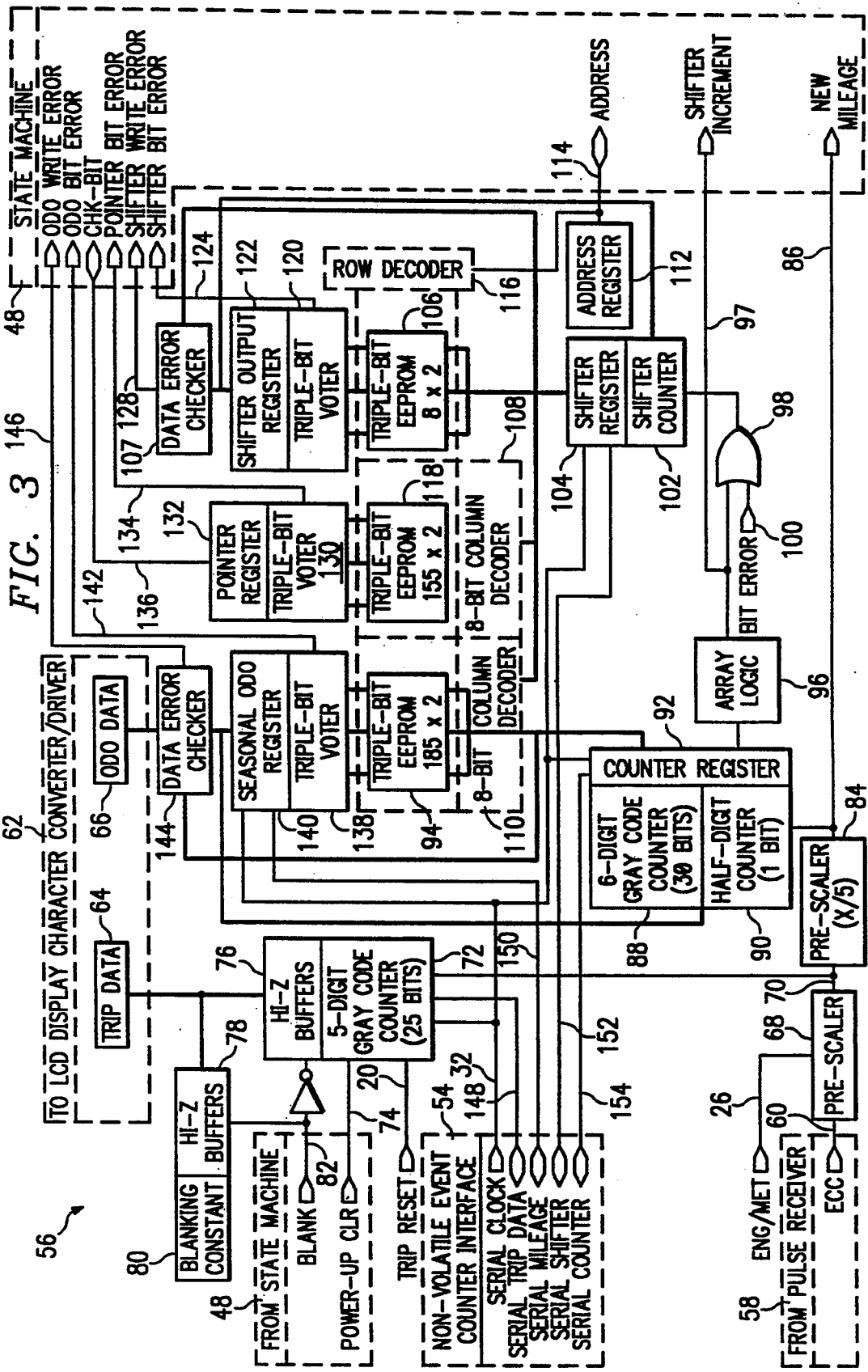

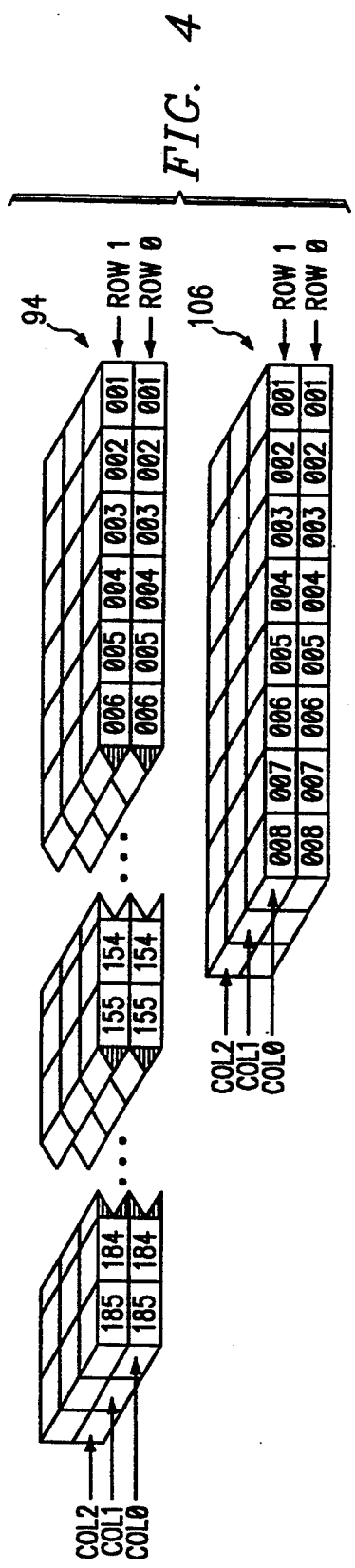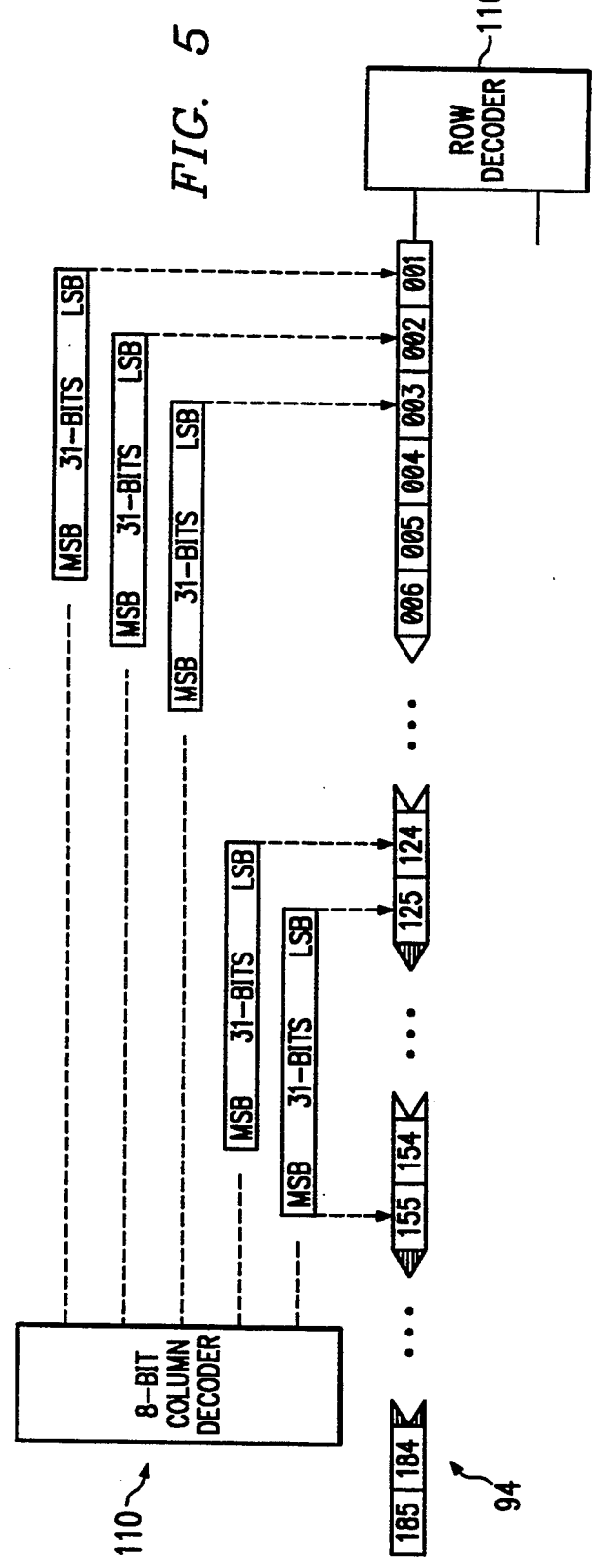

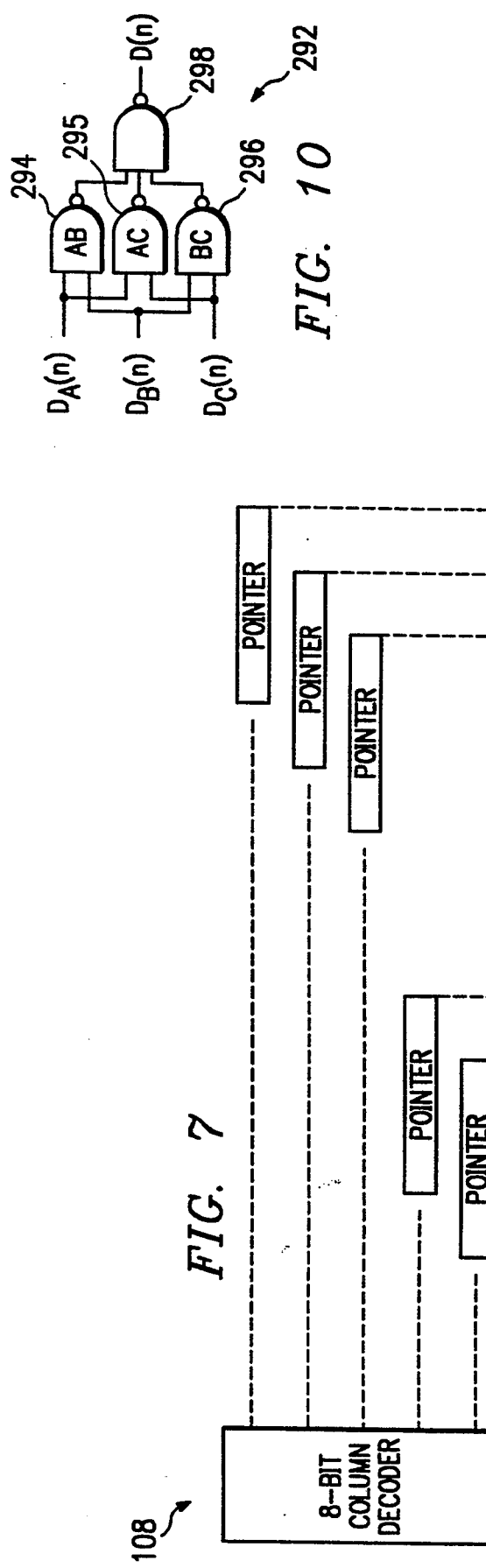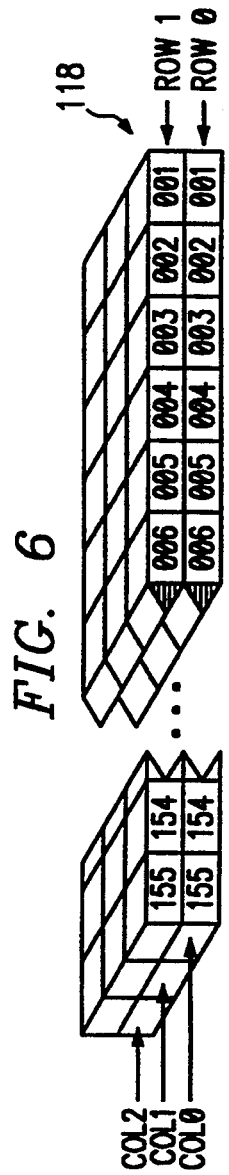
FIG. 10
FIG. 7
FIG. 6

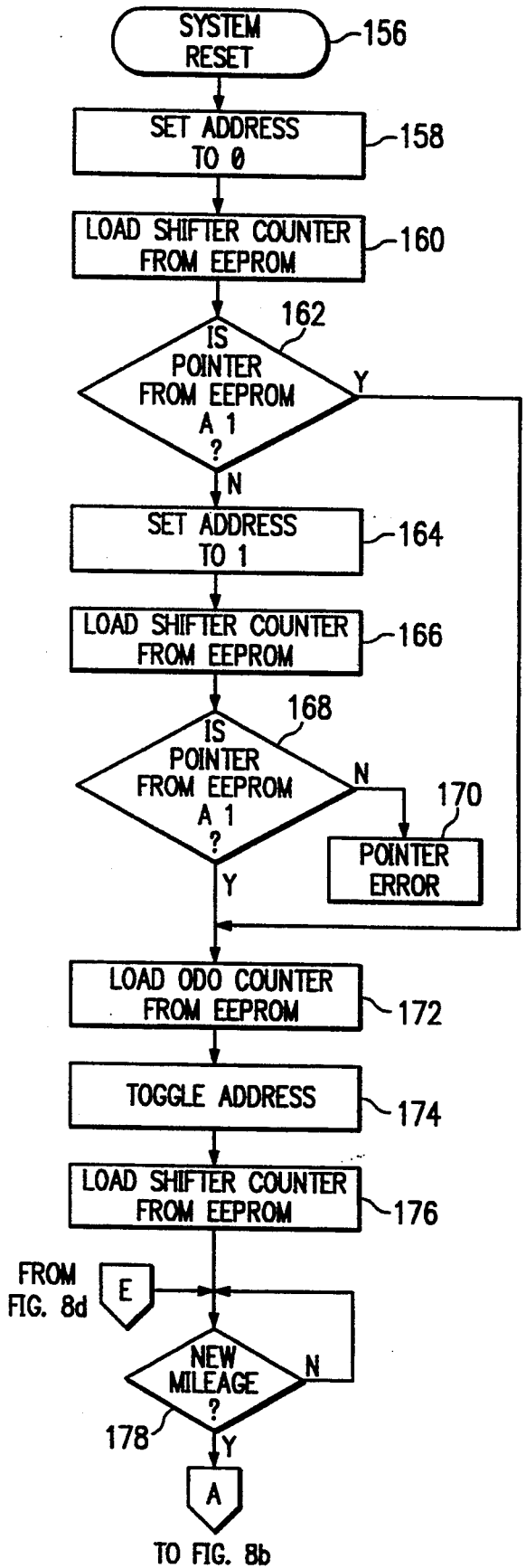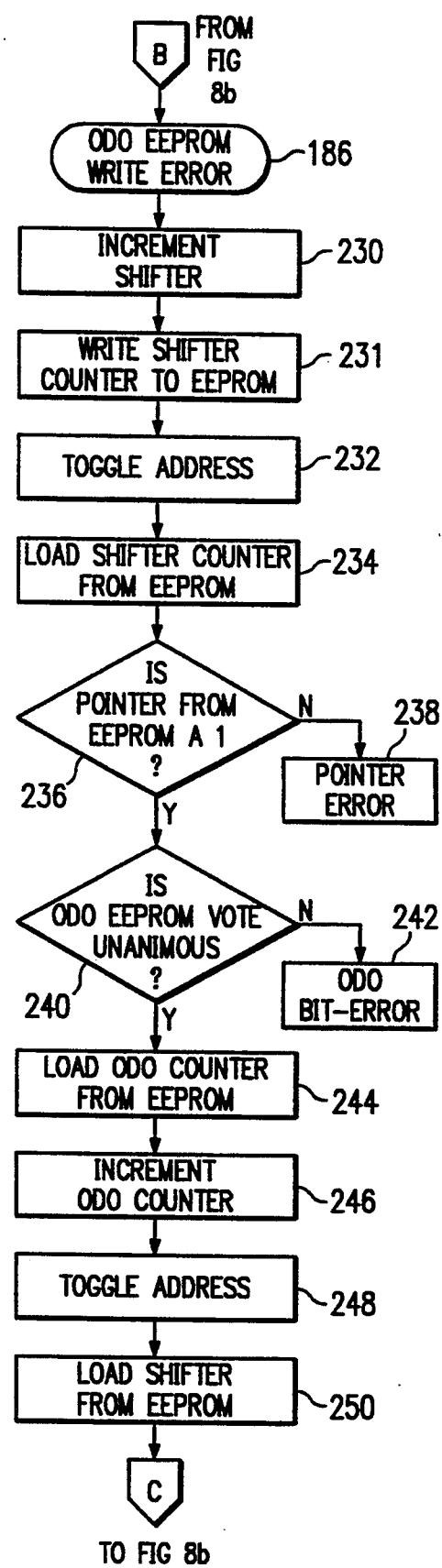

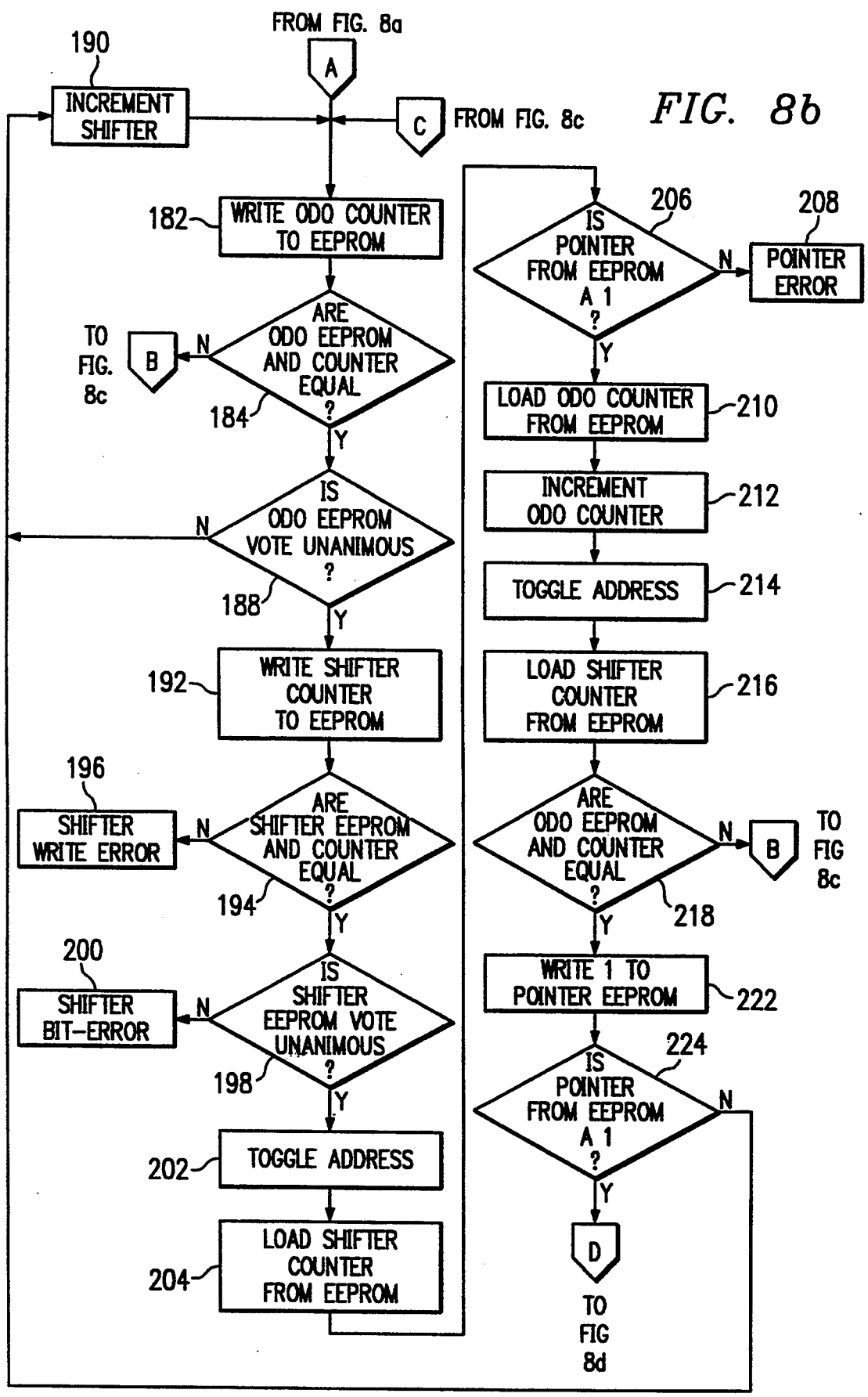

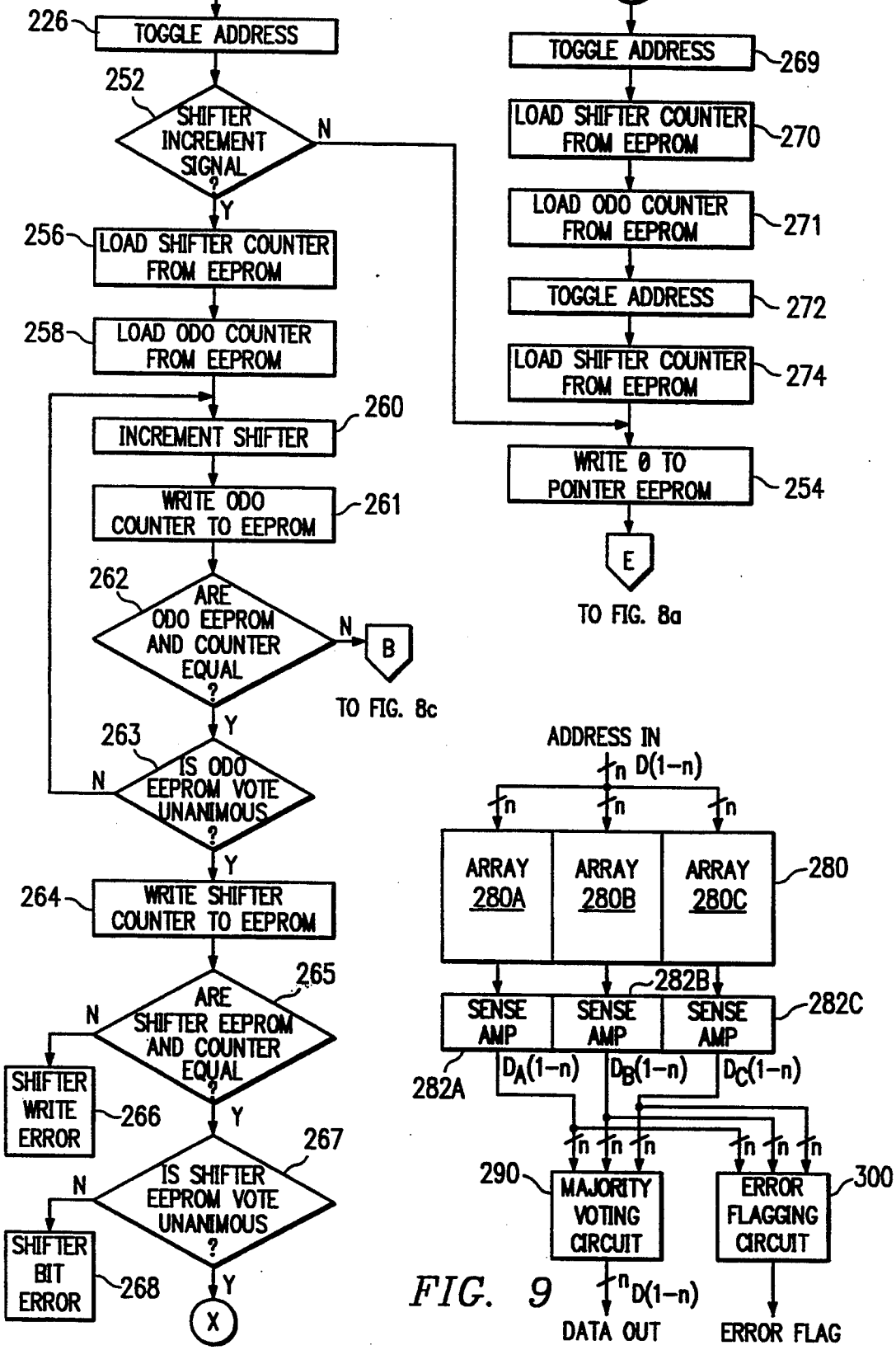

METHOD AND APPARATUS FOR MAINTAINING VARIABLE DATA IN A NON-VOLATILE ELECTRONIC MEMORY DEVICE

TECHNICAL FIELD OF THE INVENTION

This invention relates in general to the field of electronic circuits, and more particularly to an apparatus and method for maintaining variable data in a non-volatile electronic memory device.

BACKGROUND OF THE INVENTION

Volatile electronic memory devices are incapable of retaining stored data when primary power to the device is removed. However, non-volatile memory devices can retain stored data even when primary power to the device is removed. Several types of non-volatile memory devices exist. Battery-backed random access memory (RAM) can retain data when properly powered by a battery; however, battery lifetimes are limited, and a battery-backed device will lose its data when the battery wears down. Thus, in most industry applications, battery-backed RAM devices are impractical for maintaining variable data over extended periods of time.

A read-only memory (ROM) does not require a battery to retain data when primary power is removed. However, a ROM device cannot be reprogrammed with new data. Therefore, ROM's are impractical for maintaining variable data.

Erasable programmable read-only memory (EPROM) can be reprogrammed with new data, but such a reprogramming must be preceded by an erasure of the entire memory contents, typically by applying an external high voltage and exposing the entire device for lengthy periods to ultraviolet light. Thus, in most industry applications, EPROM's are impractical for maintaining variable data.

Electronically erasable programmable read-only memories (EEPROM) are non-volatile memory devices that require no batteries to retain data; furthermore, these devices are reprogrammable on an addressable basis without requiring erasure of the entire memory contents. Normal 5-volt supply voltage is sufficient to erase an EEPROM storage location.

EEPROMs are useful for numerous applications, including maintaining variable data. One such application is a digital electronic odometer for automobiles that updates an event counter value at discrete mileage distance intervals. The event counter value can be stored in an addressable EEPROM location and periodically updated without requiring erasure of other memory contents. Furthermore, the EEPROM contents will be retained even when power is removed from the circuit.

Nevertheless, using an EEPROM to maintain variable data such as an event counter value raises distinct problems. Specifically, EEPROM storage locations can undergo only a finite number of oxide tunnelling transitions (OTT) which occur when a data bit storage location is reprogrammed with opposite data from what it previously stored. An average EEPROM bit is limited to approximately 10,000 OTT's, but actual limits on OTT's will vary widely between EEPROM bits. Thus, when counting miles using an event counter value stored in a EEPROM, the least significant bit (LSB) of the particular EEPROM storage location will exhaust its limited number of OTT's after approximately 5,000 miles, assuming a resolution of 0.5 miles.

Some EEPROM applications overcome this limitation by relocating the event counter value to a different EEPROM byte storage address once a predefined number of OTT's have occurred. Thus, when the LSB of a particular byte storage address has exhausted its OTT possibilities, the entire byte is no longer used, even though seven of its eight bits remain capable of many more OTT's. This solution is therefore unnecessarily wasteful of memory space, requiring either larger memory capacity (and hence, increased semiconductor chip die area and product cost) or shorter product lifetimes due to more rapid depletion of useable memory space.

Therefore, a need has arisen in the industry for an apparatus and method to maintain variable data in a non-volatile electronic memory device, such that data is retained in the absence of power and such that available EEPROM memory space is efficiently utilized to accurately store the variable data, despite typical OTT limits of EEPROM storage devices.

SUMMARY OF THE INVENTION

The present invention presents an apparatus and method for maintaining variable data in a non-volatile electronic memory device. A first set of non-volatile bit storage locations defines a storage unit, which can later be defined by an adjustor to comprise a second set of non-volatile bit storage locations. This second set of non-volatile bit storage locations has at least one bit storage location in common with the first set of non-volatile bit storage locations.

In another aspect of the invention, a storage unit starts at a first bit within a plurality of non-volatile sequential bit storage locations. This storage unit can later be defined by an adjustor to start at a next sequential bit.

A technical advantage of the preferred embodiment is that available non-volatile electronic memory space is more efficiently utilized to accurately maintain variable data, despite typical limits on the number of data transitions which some non-volatile electronic memory devices are capable of performing, resulting in lower requirements for memory capacity, smaller semiconductor chip die area, decreased product cost, and longer product lifetimes.

Another technical advantage of the preferred embodiment is that variable data can be maintained in a non-volatile electronic memory device, such that data is retained in the absence of power.

Yet another technical advantage of the preferred embodiment is that digital electronic odometers, as compared to traditional mechanical odometers, are cheaper, more reliable, more difficult to disengage and more easily integrated into other digital electronic circuitry.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 illustrates a block diagram of the non-volatile event counter of the preferred embodiment;

FIG. 4 illustrates memory mapping for the seasonal odometer array and the shifter array of the preferred embodiment;

FIG. 5 illustrates overlapping 31-bit storage units used to access data in the seasonal odometer array of the preferred embodiment;

FIG. 6 illustrates memory mapping for the pointer array of the preferred embodiment;

FIG. 7 illustrates a shifting 1-bit storage unit used to access data in the pointer array of the preferred embodiment;

FIG. 8a-d combined are a flow chart illustrating operation of the non-volatile event counter of the preferred embodiment;

FIG. 9 illustrates a memory with three redundant memory arrays, and a majority voting circuit that determines data output; and FIG. 10 illustrates one of the majority-voting elements of the majority voting circuit.

DETAILED DESCRIPTION OF THE INVENTION

The preferred embodiment of the present invention and its advantages are best understood by referring to FIGS. 1-10 of the drawings, like numerals being used for like and corresponding parts of the various drawings.

Figure 1:
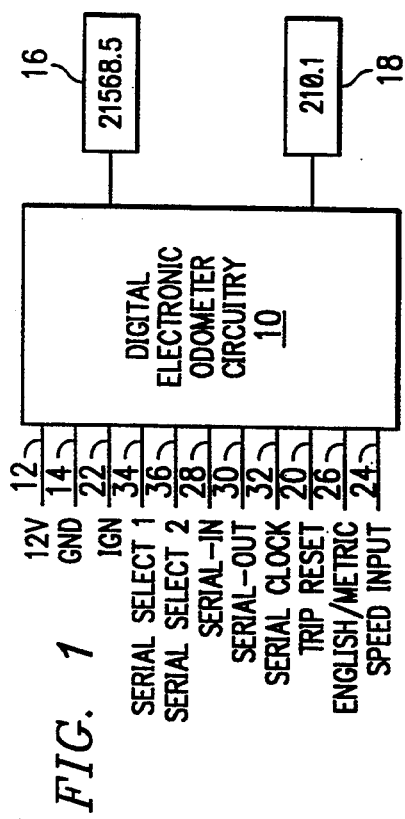
FIG. 1 illustrates a block diagram of digital electronic odometer circuitry of the preferred embodiment.

FIG. 1 illustrates a block diagram of digital electronic odometer circuitry 10 incorporating the apparatus and method for maintaining variable data in a non-volatile electronic memory device. The odometer circuitry 10 receives power through power interface connectors for voltage 12 and ground 14. An odometer display 16 shows the total distance recorded by odometer circuitry 10. The trip display 18 shows total distance recorded by odometer circuitry 10 since the trip reset 20 was last asserted. Odometer circuitry 10 calculates distance when ignition input 22 is asserted. Distance is calculated on the basis of speed input 24 which is an analog sine wave signal varying in frequency and amplitude. Speed input 24 is tied to a variable reluctance sensor which senses rotation of an automobile drive shaft. If the English/metric signal 26 is asserted, then odometer circuitry 10 calculates distance in kilometers rather than miles.

Serial_in line 28 and serial_out line 30 are provided to initialize odometer circuitry 10 for production testing. Serial clock signal 32 synchronizes the transfer of data over serial in line 28 and serial_out line 30. Serial SELECT1 line 34 and serial SELECT2 line 36 specify an internal parameter to be initialized by data provided over serial_in line 28.

Figure 2:
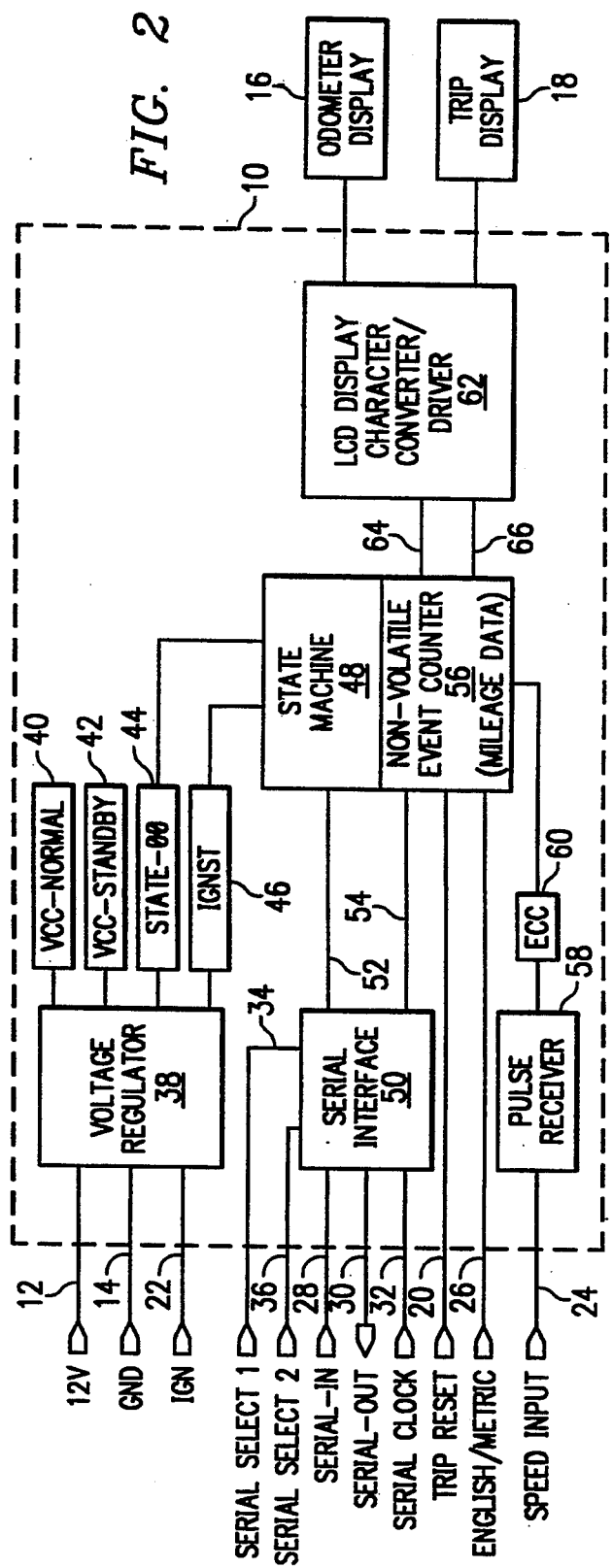
FIG. 2 illustrates an expanded block diagram of the digital electronic odometer circuitry of the preferred embodiment.

FIG. 2 illustrates an expanded block diagram of the odometer circuitry 10 of the preferred embodiment. Voltage regulator 38 maintains voltage levels at normal 5-volt logic levels appropriate for odometer circuitry 10. Specifically, voltage 12, ground 14 and ignition input 22 are converted into $V_{cc}$-normal 40, $V_{cc}$-standby 42, STATE-00 44 and IGNST 46. $V_{cc}$-normal 40 and $V_{cc}$-standby 42 provide power to odometer circuitry 10. STATE-00 44 initializes the state machine 48 upon power-up.

Serial interface 50 initializes internal odometer circuitry parameters in state machine 48 via state machine interface 52 and in non-volatile event counter 56 via non-volatile event counter interface 54. The non-volatile event counter 56 also interfaces to trip reset signal 20 and English/metric signal 26. Speed input 24 provides a sine wave cycle, which pulse receiver 58 converts into a digital pulse ($E_{cc}$) output 60. Digital pulse ($E_{cc}$) output 60 signals non-volatile event counter 56 to maintain distance information. Non-volatile event counter 56 provides data to LCD display character converter/driver 62 over trip data interface 64 and odometer data interface 66. LCD display character converter/driver 62 drives odometer display 16 and trip display 18.

FIG. 3 illustrates a block diagram of the non-volatile event counter 56 of the preferred embodiment. If English/metric signal 26 is asserted, then prescaler 68 converts digital pulse ($E_{cc}$) output 60 into an interval distance pulse 70 which pulses once every 0.1 kilometer distance increment. For reasons of clarity, the following discussion assumes that English/metric signal 26 is not asserted and that prescaler 68 outputs an interval distance pulse 70 once every 0.1 mile distance increment.

Interval distance pulse 70 goes directly to 25-bit 5-digit gray code trip meter counter 72 which stores data to 0.1 mile accuracy. Trip meter counter 72 can be cleared by asserting trip reset signal 20 or power-up clear signal 74. High impedance buffers 76 can allow data contents of trip meter counter 72 to pass through to trip data interface 64. Alternatively, high impedance buffers 78 will allow a blanking constant 80 to pass through to trip data interface 64. A blank signal 82 from state machine 48 determines which of the high impedance buffers 76 or 78 will allow data to pass through to trip data interface 64. If blanking constant 80 is passed to trip data interface 64, then trip display 18 (shown in FIG. 2) is blanked. Otherwise, trip display 18 outputs the data contents of trip meter counter 72.

For every five pulses output from prescaler 68, prescaler 84 generates a pulse. Hence, prescaler 84 outputs a pulse once every 0.5 mile distance increment. This pulse is sent to state machine 48 via new mileage signal 86. A 30-bit, 6-digit gray code counter 88 and a 1-bit, half-digit counter 90 collectively count the number of pulses output by prescaler 84. Counter 90 increments once every 0.5 mile, while counter 88 increments once every 1.0 mile. The data contents of counters 88 and 90 are latched by counter register 92, which makes the data contents available for storage in triple-bit 185×2 EEPROM seasonal odometer array 94 described in greater detail hereinbelow. Unlike a "trip" meter, a "seasonal" odometer is not normally reset.

If counter 90 contains a zero and if counter 88 contains an integer multiple of 3,000, then array logic 96 asserts shifter increment signal 97 sent to state machine 48. The output of array logic 96 also provides a logical high signal to OR gate 98. The second input to OR gate 98 receives a bit error signal 100. If either bit error signal 100 or the output of array logic 96 is a logical high, then OR gate 98 increments shifter counter 102, whose data contents are latched by shifter register 104. The data contents of shifter register 104 are made available for storage in triple-bit 8×2 EEPROM shifter array 106. The data contents of shifter register 104 are also made available to data error checker 107 and 8-bit column decoders 108 and 110.

FIG. 4 illustrates memory mapping for seasonal odometer array 94 and shifter array 106 of the preferred embodiment. Seasonal odometer array 94 has two rows labelled ROW0 and ROW1, with each row containing three 185-bit columns labelled COL0, COL1 and COL2. Shifter array 106 also has two rows labelled ROW0 and ROW1, with each row containing three 8-bit columns labelled COL0, COL1 and COL2.

Referring again to FIG. 3, address register 112 latches a binary address signal 114 specified by state machine 48. Address register 112 makes the binary address signal 114 available to row decoder 116. If binary address signal 114 is a zero, then row decoder 116 will address ROW0 of both seasonal odometer array 94 and shifter array 106 as shown in FIG. 4. If binary address signal 114 is a one, then row decoder 116 will address ROW1 of both seasonal odometer array 94 and shifter array 106 as shown in FIG. 4.

For shifter array 106, writing operations and reading operations will access all 8-bits (shown in FIG. 4) within a row (ROW0 or ROW1) addressed by row decoder 116, storing identical data in all three redundant columns (COL0-COL2) of array 106.

FIG. 5 illustrates overlapping 31-bit storage units used to access data in seasonal odometer array 94. Writing operations and reading operations will access a 31-bit storage unit within a given row (ROW0 or ROW1) storing or reading identical data in all three redundant columns (COL0-COL2) of array 94. The row (ROW0 or ROW1) is addressed by row decoder 116. The 31-bit storage unit is determined by 8-bit column decoder 110 which operates as a multiplexer/demultiplexer controlled by the output of shifter register 104. Therefore, if data contents of shifter register 104 have a value of one hundred twenty-four, then 8-bit column decoder 110 will make writing operations and reading operations access a 31-bit storage unit covering bit-125 through bit-155 (shown in FIG. 5).

Referring to FIG. 4, ROW0 of shifter array 106 stores an 8-bit shifter value specifying the 31-bit storage unit for ROW0 of seasonal odometer array 94. ROW1 of the shifter array 106 stores an 8-bit shifter value specifying the 31-bit storage unit for ROW1 of seasonal odometer array 94. Therefore, in seasonal odometer array 94, the 31-bit storage unit for ROW1 and the 31-bit storage unit for ROW0 are independently specified.

FIG. 6 illustrates memory mapping for triple-bit 115×2 EEPROM pointer array 118. Pointer array 118 has two rows labelled ROW0 and ROW1, with each row containing three 155-bit columns labelled COL0, COL1 and COL2.

FIG. 7 illustrates a shifting 1-bit storage unit used to access data in pointer array 118. Writing operations and reading operations will access a 1-bit storage unit within a given row (ROW0 or ROW1) storing or reading identical data in all three redundant columns (COL0-COL2) of array 118. The row (ROW0 or ROW1) is addressed by row decoder 116. The 1-bit storage unit is determined by 8-bit column decoder 108 which operates as a multiplexer/demultiplexer controlled by the output of shifter register 104. Therefore, if data contents of shifter register 104 have a value of one hundred twenty-four, then 8-bit column decoder 108 will make writing operations and reading operations access a 1-bit storage unit at bit-125 (shown in FIG. 7).

Referring again to FIG. 3, the pointer array 118 specifies which row (ROW0 or ROW1) of seasonal odometer array 94 stores the most recent odometer distance value sent from counter register 92. Thus, if the 1-bit storage unit in ROW0 of pointer array 118 has data contents with a value of one, then the 31-bit storage unit in ROW0 of seasonal odometer array 94 contains the most recent odometer distance value. If the 1-bit storage unit in ROW1 of pointer array 118 has data contents with a value of one, then the 31-bit storage unit in ROW1 of seasonal odometer array 94 contains the most recent odometer distance value.

To read data from shifter array 106, the state machine 48 sets address register 112 to either ROW0 or ROW1 so that row decoder 116 can address the specified row (ROW0 or ROW1). Then, data contents in the specified row (ROW0 or ROW1) of shifter array 106 are sent from all three redundant columns (COL0-COL2) of the array 106 to triple-bit voter 120.

If data contents sent from all three redundant columns (COL0-COL2) are identical, then shifter output register 122 latches the unanimously voted data value. If one of the redundant columns (COL0-COL2) fails to send identical data to triple-bit voter 120, then shifter output register 122 latches the data value agreed upon by two of the three redundant columns, and triple-bit voter 120 generates a shifter bit error signal 124 sent to state machine 48. The aspect of the preferred embodiment dealing with bit error signals is described in greater detail in connection with U.S. Patent Application Ser. No. 07/357,453, filed on May 26, 1989, entitled "Apparatus and Method for Providing Notification of Bit-Cell Failure in a Redundant-Bit-Cell Memory" by Flaherty et al., which is incorporated by reference herein. The aspect of the preferred embodiment dealing with majority bit voting is described in connection with FIGS. 9 and 10 described in greater detail hereinbelow.

The 8-bit data value latched by shifter output register 122 is then sent to data error checker 107 which compares this data value to the data value output from shifter register 104; if the two data values are not identical, then data error checker 107 generates a shifter write error signal 128 sent to state machine 48. The 8-bit data value latched by shifter output register 122 is also made available for loading into shifter counter 102, whose data contents are latched by shifter register 104.

To read data from pointer array 118, state machine 48 sets address register 112 to either ROW0 or ROW1 so that row decoder 116 can address the specified row (ROW0 or ROW1). Then, data contents are read from the specified row (ROW0 or ROW1) of shifter array 106, and the resulting 8-bit data value latched by shifter output register 122 are loaded into shifter counter 102 and latched by shifter register 104. Shifter register 104 makes the 8-bit data value available to 8-bit column decoder 108 which determines the 1-bit storage unit for the row (ROW0 or ROW1) addressed by row decoder 116. Then, data contents in the specified 1-bit storage unit and row (ROW0 or ROW1) of pointer array 118 are sent from all three redundant columns (COL0-COL2) of the array 118 to triple-bit voter 130. If data contents sent from all three redundant columns (COL0-COL2) are identical, then pointer register 132 latches the unanimously voted data value. If one of the redundant columns (COL0-COL2) fails to send identical data to triple-bit voter 130, then pointer register 132 latches the data value agreed upon by two of the three redundant columns, and triple-bit voter 130 generates a pointer bit error signal 134 sent to state machine 48. The 1-bit data value latched by pointer register 132 is then sent to state machine 48 via check-bit signal 136.

To read data from seasonal odometer array 94, the state machine 48 sets address register 112 to either ROW0 or ROW1 so that row decoder 116 can address the specified row (ROW0 or ROW1). Then, data contents are read from the specified row (ROW0 or ROW1) of shifter array 106, and the resulting 8-bit data value latched by shifter output register 122 are loaded into shifter counter 102 and latched by shifter register 104. Shifter register 104 makes the data contents available to 8-bit column decoder 110 which determines the 31-bit storage unit for the row (ROW0 or ROW1) addressed by row decoder 116. Then, data contents in the specified 31-bit storage unit and row (ROW0 or ROW1) of seasonal odometer array 94 are sent from all three redundant columns (COL0–COL2) of the array 94 to triple-bit voter 138. If data contents sent from all three redundant columns (COL0–COL2) are identical, then seasonal odometer register 140 latches the unanimously voted data value. If one of the redundant columns (COL0–COL2) fails to send identical data to triple-bit voter 138, then seasonal odometer register 140 latches the data value agreed upon by two of the three redundant columns, and triple-bit voter 138 generates an odometer bit error 142 sent to state machine 48. The 31-bit data value latched by seasonal odometer register 140 is then sent to data error checker 144 which compares this data value to the data value output from counter register 92; if the two data values are not identical, then data error checker 144 generates an odometer write error signal 146 sent to state machine 48, and only one of the two non-identical data values will pass to odometer data interface 66. The 31-bit data value latched by seasonal odometer register 140 is also made available for loading into counters 88 and 90, whose data contents are latched by counter register 92.

To initialize the non-volatile event counter 56 for production testing, a serial clock signal 32 is connected to trip meter counter 72, seasonal odometer register 140, counter register 92 and shifter register 104. This serial clock signal 32 synchronizes the transfer of data over serial trip data line 148, serial mileage line 150, serial shifter line 152 and serial counter line 154. Referring to FIG. 2, serial SELECT1 line 34 and serial SELECT2 line 36 specify to serial interface 50 which internal parameter will be initialized by data provided over serial_in line 28. Serial interface 50 uses state machine interface 52 to control the transfer of data to non-volatile event counter 56. Serial interface 50 transfers data to non-volatile event counter 56 via non-volatile event counter interface 54. Referring to FIG. 3, non-volatile event counter interface 54 comprises serial clock signal 32, serial trip data line 148, serial mileage line 150, serial shifter line 152 and serial counter line 154. Therefore, depending upon the specified internal parameter to be initialized, data can be transferred by serial interface 50 to trip meter counter 72 using serial trip data line 148, to seasonal odometer register 140 using serial mileage line 150, to shifter register 104 using serial shifter line 152, or to counter register 92 using serial counter line 154.

Table 1 illustrates the gray code data format of the preferred embodiment. A digit (Dx) is defined as a 5-bit word, with binary contents incrementing as illustrated in Table 1. The digit decimal value (Dx-value) increments from 0 through 9 and then rolls over returning to 0.

TABLE 1

| GRAY CODE DATA FORMAT | | | | | |
|---|---|---|---|---|---|
| Digit (Dx) Binary Contents | | | | | |
| b5 | b4 | b3 | b2 | b1 | Digit Decimal Value (Dx-Value) |
| 0 | 0 | 0 | 0 | 0 | 0 |
| 0 | 0 | 0 | 0 | 1 | 1 |
| 0 | 0 | 0 | 1 | 1 | 2 |

TABLE 1-continued

| GRAY CODE DATA FORMAT | | | | | |
|---|---|---|---|---|---|
| Digit (Dx) Binary Contents | | | | | |
| b5 | b4 | b3 | b2 | b1 | Digit Decimal Value (Dx-Value) |
| 0 | 0 | 1 | 1 | 1 | 3 |
| 0 | 1 | 1 | 1 | 1 | 4 |
| 1 | 1 | 1 | 1 | 1 | 5 |
| 1 | 1 | 1 | 1 | 0 | 6 |
| 1 | 1 | 1 | 0 | 0 | 7 |
| 1 | 1 | 0 | 0 | 0 | 8 |
| 1 | 0 | 0 | 0 | 0 | 9 |
| 0 | 0 | 0 | 0 | 0 | 0 |

Table 2 illustrates the data format of the 25-bit 5-digit gray code trip meter counter 72. The five digits are numbered D1 through D5. Each digit is assigned five of the twenty-five bits as shown in Table 2. Based on the digit decimal value (Dx-value) of each digit's binary contents, the digits each have decimal representations ($T_1$ through $T_5$) which collectively represent the trip distance as shown in Table 2.

TABLE 2

| TRIP METER COUNTER DATA FORMAT | | |
|---|---|---|
| (Trip Distance = $T_5 + T_4 + T_3 + T_2 + T_1$) | | |
| Digit (Dx) | Bits (bx) | Decimal Representation ($T_x$) |
| D5 | b25–b21 | D5-value $\times 10^3 = T_5$ |
| D4 | b20–b16 | D4-value $\times 10^2 = T_4$ |
| D3 | b15–b11 | D3-value $\times 10^1 = T_3$ |
| D2 | b10–b6 | D2-value $\times 10^0 = T_2$ |
| D1 | b5–b1 | D1-value $\times 10^{-1} = T_1$ |

Table 3 illustrates the data format of the counter register 92, which latches data contents of 30-bit 6-digit gray code counter 88 and 1-bit half-digit counter 90. The six digits of counter 88 are numbered D1 through D6, while the 1-bit half-digit of counter 90 is numbered as B1. Each digit is assigned five of the thirty bits in counter 88, while the half-digit is assigned one bit as shown in Table 3. Based on the digit decimal value (Dx-value) of each digit's binary contents, the digits each have decimal representations ($S_1$ through $S_6$). Based on the bit value (B1−value=0 or 1) of the half-digit's binary content, the half-digit has a decimal representation ($S_0$) which combines with digit decimal representations ($S_1$ through $S_6$) to collectively represent the seasonal odometer distance as shown in Table 3.

TABLE 3

| COUNTER REGISTER DATA FORMAT | | |
|---|---|---|
| (Seasonal Odometer | | |
| Distance = $S_6 + S_5 + S_4 + S_3 + S_2 + S_1 + S_0$) | | |
| Digit (Dx) | Bits (bx) | Decimal Representation |
| D6 | b31–b27 | D6-value $\times 10^5 = S_6$ |
| D5 | b26–b22 | D5-value $\times 10^4 = S_5$ |
| D4 | b21–b17 | D4-value $\times 10^3 = S_4$ |
| D3 | b16–b12 | D3-value $\times 10^2 = S_3$ |
| D2 | b11–b7 | D2-value $\times 10^1 = S_2$ |
| D1 | b6–b2 | D1-value $\times 10^0 = S_1$ |
| B1 | b1 | B1-value $\times 0.5 = S_0$ |

As demonstrated in Table 1, by using gray code data format, each bit (b1 through b5) undergoes two oxide tunnelling transitions (OTT) when the digit (Dx) increments from 0 through 9 and then rolls over returning to 0. (An OTT occurs when a data bit storage location in EEPROM is reprogrammed with opposite data from what it previously stored.)

Referring to FIG. 3, when counter 90 contains a zero and counter 88 contains an integer multiple of 3,000 miles (6,000 half-miles), the array logic 96 asserts shifter increment signal 97 and provides a logical high signal to OR gate 98, thus causing OR gate 98 to increment shifter counter 102 whose data contents are latched by shifter register 104. This newly incremented data value in shifter register 104 is made available to 8-bit column decoder 110.

As shown in FIG. 5, when the data value in shifter register 104 is incremented, the 31-bit storage unit is replaced by an adjacent storage unit. Thus, if the data value in shifter register 104 was previously one hundred twenty-three but is later incremented to one hundred twenty-four, then 8-bit column decoder 110 replaces the 31-bit storage unit (including bit-124 through bit-154) with a new overlapping 31-bit storage unit (including bit-125 through bit-155). Bit-124 is retired and therefore no longer used to store data.

By replacing the 31-bit storage unit in this manner every 3,000 miles (6,000 half-miles), the OTT's are more evenly distributed over bits in seasonal odometer array 94. Table 4 shows bit usage for seasonal odometer array 94 after the first 31-bit storage unit replacement performed upon counting the first 3,000 miles (6,000 half-miles).

TABLE 4
BIT USAGE FOR SEASONAL ODOMETER ARRAY

| Bits (bx) | Counts | OTTs per bit per replacement |
|---|---|---|
| b1 | 6,000 | 6,000 |
| b2–b6 (Digit-1) | 3,000 | 600 |
| b7–b11 (Digit-2) | 300 | 60 |
| b12–b16 (Digit-3) | 30 | 6 |
| b17–b21 (Digit-4) | 3 | 0.6 (average) |
| b22–b26 (Digit-5) | 0 | 0 |
| b27–b31 (Digit-6) | 0 | 0 |

Bit-1 has counted 6,000 half-miles. Therefore, bit-2 through bit-6 (Digit-1) counted 3,000 miles which caused Digit-2 to count three hundred 10-mile increments, Digit-3 to count thirty 100-mile increments, and Digit-4 to count three 1,000-mile increments. Each count in bit-1 caused one OTT, while every ten counts in a 5-bit digit caused two OTT's per bit as previously discussed in connection with Table 1. The maximum number of OTT's per bit will occur after twenty-one storage unit replacements. At that point, bit-21 will have undergone 9,333 OTT's (0.6 OTT per replacement×5 replacements+6 OTT per replacement×5 replacements+60 OTT per replacement×5 replacements+600 OTT per replacement×5 replacements+6,000 OTT per replacement×1 replacement). All subsequent bits beyond bit-21 will also undergo 9,333 OTT's before their scheduled retirement. Therefore, each bit is efficiently utilized, while bit utilization also falls conservatively below the approximate 10,000 OTT limit for an average EEPROM bit. As EEPROM performance capabilities improve to allow more OTTs for an average EEPROM bit, non-volatile event counter 56 can be modified to replace the 31-bit storage unit less frequently, thus increasing maximum counting capability or decreasing required sizes of memory arrays.

FIG. 8a–d combined are a flow chart illustrating operation of the non-volatile event counter of the preferred embodiment. Referring to FIG. 8a and FIG. 3, step 156 executes a system reset. In step 158, state machine 48 sets address register 112 to ROW0, which allows row decoder 116 to address ROW0 of pointer array 118, shifter array 106 and seasonal odometer array 94. In step 160, data contents in ROW0 of shifter array 106 are loaded into shifter counter 102 and latched by shifter register 104, which allows 8-bit column decoder 108 to determine the 1-bit storage unit for ROW0 in pointer array 118 (as shown in FIG. 7).

In step 162, data contents in the 1-bit storage unit for ROW0 of pointer array 118 are read via check-bit signal 136. If check-bit signal 136 has a value of zero, then ROW0 of seasonal odometer array 94 does not store the most recent odometer distance value. In that case, step 164 directs state machine 48 to set address register 112 to ROW1. In step 166, data contents in ROW1 of shifter array 106 are loaded into shifter counter 102 and latched by shifter register 104, which allows 8-bit column decoder 108 to determine the 1-bit storage unit for ROW1 in pointer array 118.

In step 168, data contents in the 1-bit storage unit for ROW1 of pointer array 118 are read via check-bit signal 136. If check-bit signal 136 has a value of zero, then ROW1 of seasonal odometer array 94 does not store the most recent odometer distance value. In that case, since neither ROW0 nor ROW1 of seasonal odometer array 94 store the most recent odometer distance value, a pointer error is generated in step 170.

If check-bit signal 136 in either step 162 or step 168 has a value of one, then the corresponding row (ROW0 or ROW1) of seasonal odometer array 94 does store the most recent odometer distance value, and control passes to step 172. At step 172, address register 112 and shifter register 104 are not modified. This allows row decoder 116 to address the row containing the most recent odometer distance value, while 8-bit column decoder 110 is allowed to determine the 31-bit storage unit for the corresponding row in seasonal odometer array 94 (as shown in FIG. 5). Step 172 reads data contents in the specified row and 31-bit storage unit of seasonal odometer array 94, and this 31-bit value from seasonal odometer register 140 is loaded into counters 88 and 90 whose data contents are latched by counter register 92. This allows counters 88 and 90 to increment the mileage value when the next new mileage signal 86 is output by prescaler 84.

After counter register 92 is initialized in this manner, step 174 toggles address register 112 to ROW1 if check-bit signal 136 in step 162 had a value of one or toggles address register 112 to ROW0 if check-bit signal 136 in step 168 had a value of one. This allows row decoder 116 to address the row where new data from counter register 92 will be stored. In step 176, for the newly specified row, data contents of shifter array 106 are loaded into shifter counter 102 and latched by shifter register 104. This allows 8-bit column decoder 110 to determine the 31-bit storage unit for the newly specified row of seasonal odometer array 94 (as shown in FIG. 5). Step 178 then enters a WAIT cycle until prescaler 84 asserts new mileage signal 86 indicating a new 0.5 mile distance increment.

When prescaler 84 asserts new mileage signal 86, control passes to step 182 shown in FIG. 8b, which stores the data contents of counter register 92 in seasonal odometer array 94. Step 184 then reads the contents of seasonal odometer array 94, and data error checker 144 compares the 31-bit data value latched by seasonal odometer register 140 to the data value output from counter register 92. This comparison detects incorrect data by comparing the data sent by seasonal odometer register 140 with the data actually stored in seasonal odometer array 94. If the two data values are not identical, then data error checker 144 asserts odometer write error signal 146, and control passes to step 186 shown in FIG. 8c described in greater detail hereinbelow.

If the two data values are equal, then step 188 uses triple-bit voter 138 to determine whether data contents sent from all three redundant columns (COL0–COL2) of seasonal odometer array 94 were identical. This comparison detects incorrect data by comparing the data actually stored in redundant columns. If the data contents were not identical, then control passes to step 190 which replaces the 31-bit storage unit by incrementing shifter counter 102 via bit error signal 100. Control then returns to step 182.

If data contents sent from all three redundant columns (COL0–COL2) were identical, then control passes to step 192. Since step 190 increments shifter counter 102, step 192 stores the potentially modified data contents of shifter counter 102 (latched by shifter register 104) to shifter array 106. Step 194 then reads the data contents of shifter array 106, and data error checker 107 compares the 8-bit data value latched by shifter output register 122 to the data value output from shifter register 104. If the two data values are not identical, then data error checker 107 asserts shifter write error signal 128 as shown in step 196.

If the two data values are equal, then step 198 uses triple-bit voter 120 to determine whether data contents sent from all three redundant columns (COL0–COL2) of shifter array 106 were identical. If the data contents were not identical, then triple-bit voter 120 asserts shifter bit error signal 124, with control passing to step 200.

If the data contents sent from all three redundant columns (COL0–COL2) were identical, then control passes to step 202. As a further check to detect incorrect data, the odometer distance value actually stored by step 182 into seasonal odometer array 94 is compared with the previous odometer distance value as it existed before step 182. The odometer distance value stored by step 182 should equal the previous odometer distance value incremented by one count.

To achieve this comparison, step 202 toggles address register 112, and step 204 loads shifter counter 102 with the shifter value from the newly specified row of shifter array 106. Step 206 reads the 1-bit storage unit via check-bit signal 136 from the specified row of pointer array 118. If check-bit signal 136 is a zero, then step 208 generates a pointer error. If check-bit signal 136 is a one, then step 210 reads the previous odometer distance value from seasonal odometer array 94 and loads this value from seasonal odometer register 140 into counters 88 and 90. Step 212 then increments counters 88 and 90.

Step 214 toggles address register 112, and step 216 loads shifter counter 102 with the shifter value from the newly specified row of shifter array 106. Step 218 reads the most recently written odometer distance value from seasonal odometer array 94, and data error checker 144 compares this value latched by seasonal odometer register 140 with the previous odometer distance value incremented by one count, which resides in counters 88 and 90 latched by counter register 92. If the two values are not identical, then data error checker 144 asserts an odometer write error signal 146 and control passes to step 186 shown in FIG. 8c described in greater detail hereinbelow.

If the two odometer distance values are equal, then step 222 writes a one to the 1-bit storage unit in the presently addressed row of pointer array 118, indicating that the presently addressed row of seasonal odometer array 94 contains the most recent odometer distance value. Step 224 then reads the 1-bit storage unit and verifies that check-bit signal 136 is a one. If check-bit signal 136 is not a one, then the write operation was unsuccessful, and control passes to step 190 which shifts the 1-bit storage unit by incrementing shifter counter 102 via bit error signal 100. If check-bit signal 136 is a one, then control passes to step 226 shown in FIG. 8d described in greater detail hereinbelow.

If step 184 or step 218 determines that an attempted write operation to seasonal odometer array 94 was unsuccessful, then control passes to step 186 shown in FIG. 8c. Step 230 replaces the 31-bit storage unit by incrementing shifter counter 102. Step 231 stores the newly incremented data contents of shifter counter 102 (latched by shifter register 104) to shifter array 106. Then, the previous odometer distance value as it existed before step 182 is retrieved, incremented and used as the basis for another attempted write operation.

Step 232 toggles address register 112, and step 234 loads shifter counter 102 with the shifter value from the newly specified row of shifter array 106. Step 236 reads the 1-bit storage unit via check-bit signal 136 from the specified row of pointer array 118. If check-bit signal 136 is not a one, then step 238 generates a pointer error. If check-bit signal 136 is a one, then step 240 reads the previous odometer distance value from seasonal odometer array 94 and uses triple-bit voter 138 to determine whether data contents sent from all three redundant columns (COL0–COL2) were identical. If the data contents were not identical, then triple-bit voter 138 asserts odometer bit error signal 142, with control passing to step 242.

If the data contents sent from all three redundant columns (COL0–COL2) were identical, then control passes to step 244, which loads the previous odometer distance value from seasonal odometer register 140 into counters 88 and 90. Step 246 then increments counters 88 and 90. Step 248 toggles address register 112, and step 250 loads shifter counter 102 with the shifter value from the newly specified row of shifter array 106. Control then returns to step 182.

In FIG. 8b, if step 224 determines that check-bit signal 136 is a one, then control passes to step 226 shown in FIG. 8d. Step 226 toggles address register 112 to the row where new data from counter register 92 will be stored. Then, step 252 determines whether array logic 96 has asserted shifter increment signal 97. If no, then control passes to step 254, which writes a zero to the 1-bit storage unit in the newly addressed row of pointer array 118, indicating that the newly addressed row of seasonal odometer array 94 does not contain the most recent odometer distance value. Control then returns to step 178 in FIG. 8a, which waits for prescaler 84 to assert new mileage signal 86 indicating a new 0.5 mile distance increment.

If step 252 determines that array logic 96 has asserted shifter increment signal 97, then control passes to step 256, which loads shifter counter 102 with the shifter value from the specified row of shifter array 106. Step 258 reads the odometer distance value from seasonal odometer array 94 and loads this value from seasonal odometer register 140 into counters 88 and 90 latched by counter register 92.

Step 260 then increments shifter counter 102 and therefore replaces the 31-bit storage unit in the specified row of seasonal odometer array 94. Step 261 stores the data contents of counter register 92 to the new 31-bit storage unit in seasonal odometer array 94.

Step 262 then reads the contents of seasonal odometer array 94, and data error checker 144 compares the 31-bit data value latched by seasonal odometer register 140 to the data value output from counter register 92. This comparison detects incorrect data by comparing the data sent by seasonal odometer register 140 with the data actually stored in seasonal odometer array 94. If the two data values are not identical, then data error checker 144 asserts odometer write error signal 146, and control passes to step 186 shown in FIG. 8c.

If the two data values are equal, then step 263 uses triple-bit voter 138 to determine whether data contents sent from all three redundant columns (COL0–COL2) of seasonal odometer array 94 were identical. This comparison detects incorrect data by comparing the data actually stored in redundant columns. If the data contents were not identical, then control passes to step 260 which replaces the 31-bit storage unit by incrementing shifter counter 102 via bit error signal 100.

If data contents sent from all three redundant columns (COL0–COL2) were identical, then control passes to step 264. Step 264 stores the incremented data contents of shifter counter 102 (latched by shifter register 104) to shifter array 106. Step 265 then reads the data contents of shifter array 106, and data error checker 107 compares the 8-bit data value latched by shifter output register 122 to the data value output from shifter register 104. If the two data values are not identical, then data error checker 107 asserts shifter write error signal 128 as shown in step 266.

If the two data values are equal, then step 267 uses triple-bit voter 120 to determine whether data contents sent from all three redundant columns (COL0–COL2) of shifter array 106 were identical. If the data contents were not identical, then triple-bit voter 120 asserts shifter bit error signal 124, with control passing to step 268.

If the data contents sent from all three redundant columns (COL0–COL2) were identical, then control passes to step 269. To reload the most recent odometer distance value into counters 88 and 90, step 269 toggles address register 112, and step 270 loads shifter counter 102 with the shifter value from the newly specified row of shifter array 106. Step 271 reads the most recent odometer distance value from seasonal odometer array 94 and loads this value from seasonal odometer register 140 into counters 88 and 90 latched by counter register 92.

To prepare for storage of a new odometer distance value, step 272 toggles address register 112 to the row where new data from counter register 92 will be stored, and step 274 loads shifter counter 102 with the shifter value from the newly specified row of shifter array 106. Control then passes to step 254.

Since shifter register 104 outputs the same shifter value to both of 8-bit column decoders 108 and 110, the 1-bit storage unit in ROW0 of pointer array 118 will be replaced as often as the 31-bit storage unit in ROW0 of seasonal odometer array 94, and the 1-bit storage unit in ROW1 of pointer array 118 will be replaced as often as the 31-bit storage unit in ROW1 of seasonal odometer array 94. ROW0 of shifter array 106 stores the shifter value for ROW0 of pointer array 118 and seasonal odometer array 94, while ROW1 of shifter array 106 stores the shifter value for ROW1 of pointer array 118 and seasonal odometer array 94.

In one alternative embodiment, a second shifter array (not shown) stores shifter values for ROW0 and ROW1 of seasonal odometer array 94, while shifter array 106 stores shifter values for ROW0 and ROW1 of pointer array 118. With additional circuitry (not shown), a separate shifter value can be sent to 8-bit column decoder 110.

In another alternative embodiment, shifter array 106 has two additional rows (not shown). The two additional rows store shifter values for ROW0 and ROW 1 of seasonal odometer array 94, while the original two rows store shifter values for ROW0 and ROW1 of pointer array 118. In this embodiment, a second row decoder (not shown) addresses the two additional rows of shifter array 106. With additional circuitry (not shown) a separate shifter value can be sent to 8-bit column decoder 110.

When prescaler 84 asserts new mileage signal 86 indicating a new 0.5-mile distance increment, the 1-bit storage unit in ROW0 of pointer array 118 typically undergoes one OTT, and the 1-bit storage unit in ROW1 of pointer array 118 typically undergoes one OTT.

Therefore, before a bit in pointer array 118 is shifted out of the 1-bit storage unit, the bit will typically undergo 6,000 OTT's (1 OTT per 0.5 mile distance increment), which conservatively falls below the approximate 10,000 OTT limit for a typical EEPROM bit.

As shown in FIG. 9, each array 94, 106 and 118 comprise three identical, redundant-bit-cell columns (shown in FIGS. 4 and 6) 280a, 280b and 280c. For each data bit desired to be stored into the array, a redundant erase or write operation is performed on each of the redundant-bit-cell columns 280a, 280b and 280c, such that the data bit is redundantly stored in the corresponding bit-cell of each columns. It is assumed that, for any set of redundant-bit-cells, only one bit-cell failure will occur during the useful life of the memory.

To read a data word of N bits, an address for the data word $D(1-N)$ is presented identically to each of the three redundant bit-cell columns 280a, 280b and 280c as previously discussed herein. For each redundant column, the logic states (1 or 0) of the data bits for the addressed data word are sensed by a corresponding sense amplifier, 282a, 282b or 282c. The redundant addressed data words—$D_A(1-N)$, $D_B(1-N)$ and $D_C(1-N)$—retrieved by the read operation are input to a majority voting circuit 290.

The majority voting circuit 290 receives each of the redundant data words, and provides a single data output word $D(1-N)$ in response to the read operation. If no bit-cell failures occur, each of the redundant data words $D_A(1-N)$, $D_B(1-N)$ and $D_C(1-N)$ is identical (i.e., each corresponding data bit has an identical logic state) and majority voting circuit 290 provides a corresponding output data word. If, however, a bit-cell failure occurs, the majority voting circuit 290 detects that the logic states for the corresponding redundant data bits are not identical and selects as the logic state for that output data bit the majority logic state (i.e., the logic state of the two matching data bits).

Thus, for the redundant data words $D_A$, $D_B$, and $D_C$, majority voting circuit 290 implements a majority-voting operation defined by the Boolean expression: $AB+AC+BC=D$, where (ABC) are the logic states of corresponding redundant data bits, and D is the logic state of the output data bit. The Boolean operation performed by the majority voting circuit can be implemented using any number of logic configurations that are routine in design and fabrication. The redundant data words $D_A$, $D_B$ and $D_C$ retrieved during the read operation are also provided to an error flagging circuit 300. The error flagging circuit detects any bit-cell failure, and provides a notification of such failure.

Sense amplifiers 282a-c are used to detect whether the addressed bit-cell is in the logic state 1 or 0. Depending upon the bit-cell logic state, each sense amplifiers 282a-c outputs data bits with nominal logic state levels of 0 and +5 volts. Majority voting circuit 290 comprises a plurality of N identical majority-voting elements 292 (as shown in FIG. 10). Each majority-voting element 292 receives a corresponding data bit from each of the redundant data words $D_A(1-N)$, $D_B(1-N)$ and $D_C(1-N)$ output from respective sense amplifiers 282a, 282b and 282c. That is, for each set of redundant data words, the corresponding redundant data bits are provided to a respective majority-voting element that performs the majority-voting operation to select an appropriate logic state for the corresponding output data bit.

As shown in FIG. 10, each majority-voting element 292 (of the majority-voting circuit 290 in FIG. 9) comprises four NAND gates 294, 295, 296 and 298. NAND gate 294 (AB) receives corresponding redundant data bits $D_A(n)$ and $D_B(n)$ from redundant data words $D_A$ and $D_B$. NAND gate 295 (AC) receives corresponding redundant data bits $D_A(n)$ and $D_C(n)$ from the redundant data words $D_A$ and $D_C$. NAND gate 296 (BC) receives the corresponding redundant data bits $D_B(n)$ and $D_C(n)$ from the redundant data words $D_B$ and $D_C$, the output of each of the NAND gates 294, 295 and 296 form the inputs to NAND gate 298. The output of NAND gate 298 D(n) is the output data bit logic state selected by the majority-voting element 292.

To illustrate the operation of majority-voting element 292, assume that the redundant data bits $D_A(n)D_B(n)D_C(n)$ input to majority-voting element 292 are either logic states (100) or (000). The outputs from the NAND gates 294 (AB), 295 (AC), and 296 (BC) will all be logic state 1, so that the output from NAND gate 298 will be a logic state 0, corresponding to the majority logic state for the redundant data bits. On the other hand, if the redundant data bits input to majority-voting element 292 are logic states (110), then the output from NAND gate 294 (AB) is a logic state 0, while the output from the other two NAND gates 295 (AC) and 296 (BC) are logic state 1, so that the output from NAND gate 298 is a data bit with logic state 1 corresponding to the majority logic state of the input redundant data bits. Likewise, if the redundant data bits input to majority-voting element 292 are logic states (111), the output data bit from NAND gate 298 is a logic state 1, corresponding to the unanimous logic state for the input redundant data bits.

Thus, for an N-bit data word, majority-voting circuit 290 (FIG. 9) includes N majority-voting elements 292, each coupled to received corresponding data bits $D_A(n)$, $D_B(n)$ and $D_C(n)$. Each majority-voting element 292 implements the majority-voting operation to provide an output data bit D(n) with a logic state corresponding to the majority logic state for the input data bits $D_A(n)$, $D_B(n)$, $D_C(n)$. As a result, the output from majority-voting circuit 290 is an output data word D(1-N) for which each data bit has been tested for bit-cell failure, using the redundant-bit-cell majority-voting technique of this invention to correct (through the majority-voting operation) a bit-cell failure affecting any of the data bits of the addressed data word.

The specific logic implementation of a majority-voting element 292 is a matter of routine design choice in implementing the Boolean expression: AB+AC+BC=D. For example, a majority-voting element can be implemented with AND gates replacing NAND gates 294, 295 and 296, and an OR gate replacing NAND gate 298. Moreover, the majority-voting elements can be implemented dynamically using precharged transistors (an advantage of the dynamic implementation is that significantly fewer transistor elements are required, although timing considerations become more important).

Although the seasonal odometer array 94 counts in a gray code data format, other data formats such as binary coded decimal and hexadecimal representations can be used to store data. The preferred embodiment uses a gray code data format to represent mileage data stored in array 94 to more evenly distribute the oxide tunnelling transitions (OTTs) over several bits.

Although the preferred embodiment has been described in connection with a non-volatile counter for an odometer, it can also be used in connection with other applications which either increment or decrement a value by 1 or several counts at a time. Furthermore, preferred embodiment can be used to store randomly variable data with no discernable pattern of change. In that case, register 92 would receive data from either a parallel or serial input rather than from counters 88 and 90. Shifter increment signal 97 would not be used by state machine 48 because the number of oxide tunnelling transitions (OTTs) would not be predictable for any particular bit. Similarly, the output of array logic 96 would need to be detached from OR gate 98. Signal 86 would notify state machine 48 of a new value contained in register 92 available for storage in array 94. State machine 48 could then store the data value from register 92 into one or both rows of array 94. The apparatus and method for maintaining variable data in a non-volatile electronic memory device would still use triple-bit voters 120, 130 and 138, along with data error checkers 107 and 144 to detect instances when data is not properly stored in arrays 94, 106 and 118. If an error condition is detected, the storage units in arrays 94 and 118 could be redefined by one or more bits at a time by incrementing shifter counter 102. Furthermore, the variable data from counter register 92 can be stored in both rows of array 94, and data stored in one of the rows in array 94 could be relied upon in cases where data stored in the second row proved unreliable.

Although the preferred embodiment has been described in connection with LCD displays 16 and 18, other types of displays such as light emitting diode (LED) displays, gas plasma displays, vacuum florescent displays, raster scan screens and any other later developed displays could be used as well. In the preferred embodiment, an EEPROM FAMOS structure is used to implement the various non-volatile arrays. However, the apparatus and method for maintaining variable data in a non-volatile electronic memory device can be used with non-volatile memory devices comprising any type of bit structure.

Although the preferred embodiment and its advantages have been described in detail, it should be understood that various changes, substitutions and alterations can be made herein without departing from the spirit and scope of the invention as defined by the appended claims.

What is claimed is:

1. Apparatus for maintaining variable data in a non-volatile electronic memory device comprising:
   a non-volatile memory array comprising a plurality of non-volatile bit storage locations, a first set of said bit storage locations and a second set of bit storage locations defining a storage unit, wherein the bit locations of said storage unit are a subset of the bit locations of said memory array; and
   a shifter array operable to redefine said storage unit to comprise said second set of said bit storage locations and a third set of bit storage locations, said third set including at least one bit not within said first set.

2. The apparatus of claim 1 wherein said non-volatile memory array comprises an EEPROM array.

3. The apparatus of claim 1, and further comprising input circuitry operable to send variable data to said storage unit.

4. The apparatus of claim 3 wherein said input circuitry is operable to format said variable data as gray code.

5. The apparatus of claim 1 and further comprising a counter operable to generate said variable data.

6. The apparatus of claim 5 wherein said counter is operable to format said variable data as gray code.

7. The apparatus of claim 1 wherein said variable data comprises an odometer reading.

8. The apparatus of claim 1 wherein said shifter array is operable to redefine said storage unit in response to a shifter adjust signal.

9. The apparatus of claim 8 wherein said shifter adjust signal causes said shifter array to redefine said storage unit by one bit storage location.

10. The apparatus of claim 8 and further comprising a monitor operable to generate said shifter adjuster signal in response to a monitor detecting a specified number of transitions occurring in said storage unit.

11. The apparatus of claim 8 further comprising a monitor operable to generate said shifter adjust signal in response to said monitor detecting an incorrect data actually stored in said storage unit.

12. The apparatus of claim 11 and further comprising input circuitry operable to send variable data to said storage unit and wherein said monitor is operable to detect said incorrect data by comparing said variable data sent by said input circuitry with said variable data actually stored in said storage unit.

13. The apparatus of claim 11 and further comprising input circuitry operable to send variable data to a plurality of redundant storage units and wherein said monitor is operable to detect said incorrect data by comparing said variable data actually stored in said storage units.

14. The apparatus of claim 11 and further comprising:
   input circuitry operable to send variable data to said storage unit;
   a counter operable to generate said variable data; and
   a second storage unit and wherein said monitor is operable to detect said incorrect data by comparing said variable data actually stored in said storage unit with an earlier data stored in said second storage unit.

15. The apparatus of claim 11 and further comprising:
   input circuitry operable to send variable data to said storage unit;
   a counter operable to generate said variable data;
   a second storage unit; and
   correcting circuitry operable to correct said incorrect data by modifying an earlier data stored in said second storage unit.

16. Apparatus for maintaining variable data in a non-volatile electronic memory device, comprising:
   a memory array comprising a plurality of non-volatile sequential bit storage locations and including a storage unit starting at a first bit, said storage unit comprising a plurality of sequential bit storage locations which are a subset of the bit storage locations of said memory array; and
   a shifter array operable to redefine said storage unit to start at a next sequential bit of said sequential bit storage locations.

17. The apparatus of claim 16, and further comprising input circuitry operable to send variable data to said storage unit.

18. The apparatus of claim 17 wherein said input circuitry is operable to format said variable data as gray code.

19. The apparatus of claim 16 and further comprising a counter operable to generate said variable data.

20. The apparatus of claim 19 wherein said counter is operable to format said variable data as gray code.

21. The apparatus of claim 16 wherein said variable data comprises an odometer reading.

22. The apparatus of claim 16 wherein said shifter array is operable to redefine said storage unit in response to a shifter increment signal.

23. The apparatus of claim 22 and further comprising a monitor operable to generate an unreliability signal in response to said monitor detecting a specified number of transitions occurring in said storage unit.

24. The apparatus of claim 22 and further comprising a monitor operable to generate said shifter adjust signal in response to said monitor detecting an incorrect data actually stored in said storage unit.

25. The apparatus of claim 24 and further comprising input circuitry operable to send variable data to said storage unit and wherein said monitor is operable to detect said incorrect data by comparing said variable data sent by said input circuitry with said variable data actually stored in said storage unit.

26. The apparatus of claim 24 and further comprising input circuitry operable to send variable data to a plurality of redundant storage units and wherein said monitor is operable to detect said incorrect data by comparing said variable data actually stored in said storage units.

27. The apparatus of claim 24 and further comprising:
   input circuitry operable to send variable data to said storage unit;
   a counter operable to generate said variable data; and
   a second storage unit and wherein said monitor is operable to detect said incorrect data by comparing said variable data actually stored in said storage unit with an earlier data stored in said second storage unit.

28. The apparatus of claim 24 and further comprising:
   input circuitry operable to send variable data to said storage unit;
   a counter operable to generate said variable data;
   a second storage unit; and
   correcting circuitry operable to correct said incorrect data by modifying an earlier data stored in said second storage unit.

29. A method for maintaining variable data in a non-volatile electronic memory device comprising the steps of:

provuding a non-volatile memory array including a plurality of non-volatile bit storage locations;

defining a subset of said memory array storage locations as a storage unit, said storage unit comprising a first set of non-volatile bit storage locations and a second set of non-volatile bit storage locations;

sending data to said storage unit; and in response to a shifter adjust signal, redefining said storage unit to comprise said second set of non-volatile bit storage locations said first set of bit storage and a third set of non-volatile bit storage locations, said third set including at least one bit not within said first set.

30. The method of claim 29 wherein said step of sending data comprises the step of sending data to said storage unit in a gray code format.

31. The method of claim 29 and further comprising the step of generating said data with a counter.

32. The method of claim 31 wherein said step of generating said data comprises the step of formatting said data as gray code.

33. The method of claim 31 wherein said step of generating said data comprises the step of counting occurrences of an interval distance pulse.

34. The method of claim 29 and further comprising the step of generating said shifter adjust signal in response to detecting a specified number of transitions occurring in said storage unit.

35. The method of claim 29 and further comprising the step of generating said shifter adjust signal in response to detecting an incorrect data actually stored in said storage unit.

36. The method of claim 35 wherein said step of generating said shifter adjust signal comprises the step of detecting said incorrect data by comparing said data sent to said storage unit with said data actually stored in said storage unit.

37. The method of claim 35 and further comprising the steps of:

defining at least one redundant storage unit; and sending said data to said at least one redundant storage unit and wherein said step of generating said shifter adjust signal comprises the step of detecting said incorrect data by comparing said data actually stored in said storage unit to said data stored in said at least one redundant storage unit.

38. The method of claim 37 wherein said step of defining at least one redundant storage unit comprises defining first and second redundant storage unit and wherein said step of generating said shifter adjust signal comprises the step of detecting a data bit that does not have the same value for said storage unit and said first and second redundant storage units.

39. The method of claim 35 and further comprising the step of generating said data with a counter and the step of sending data to a second storage unit and wherein said step of generating said shifter adjust signal comprises the step of detecting said incorrect data by comparing said data actually stored in said storage unit with an earlier data stored in said second storage unit.

40. The method of claim 35 and further comprising the steps of:

generating said data with a counter;

sending data to a second storage unit; and correcting said incorrect data by modifying an earlier data stored in said second storage unit.

41. A method for maintaining variable data in a non-volatile electronic memory device comprising the steps of:

providing a memory array including a plurality of non-volatile sequential bit storage locations;

defining a storage unit to include a sequential subset of said memory array locations, said storage unit to start at a first bit of said sequential subset;

sending data to said storage unit;

in response to a shifter increment signal, redefining said storage unit to start at a next sequential bit of said non-volatile sequential bit storage locations.

42. The method of claim 41 wherein said step of sending data comprises the step of sending data to said storage unit in a gray code format.

43. The method of claim 41 and further comprising the step of generating said data with a counter.

44. The method of claim 43 wherein said step of generating said data comprises the step of formatting said data as gray code.

45. The method of claim 43 wherein said step of generating said data comprises the step of counting occurrences of an interval distance pulse.

46. The method of claim 41 and further comprising the step of generating said shifter increment signal in response to detecting a specified number of transitions occurring in said storage unit.

47. The method of claim 41 and further comprising the step of generating said shifter increment signal in response to detecting an incorrect data actually stored in said storage unit.

48. The method of claim 47 wherein said step of generating said shifter increment comprises the step of detecting said incorrect data by comparing said data sent to said storage unit with said data actually stored in said storage unit.

49. The method of claim 47 and further comprising the steps of:

defining at least one redundant storage unit; and sending said data to said at least one redundant storage unit and wherein said step of generating said shifter increment signal comprises the step of detecting said incorrect data by comparing said data actually stored in said storage unit with said data stored in said at least one redundant storage unit.

50. The method of claim 47 and further comprising the step of generating said data with a counter and the said step of generating said shifter increment signal comprises the step of detecting said incorrect data by comparing said data actually stored in said storage unit with an earlier data stored in said second storage unit.

51. The method of claim 47 and further comprising the steps of:

generating said data with a counter;

sending data to a second storage unit; and correcting said incorrect data by modifying an earlier data stored in said second storage unit.

52. A non-volatile event counter comprising:

counting circuitry operable to count occurrences of an event;

a first non-volatile memory comprising a plurality of first overlapping storage units wherein at least some of said first overlapping storage units have no data stored in at least a portion thereof at any given time; and control circuitry operable to select one of said first overlapping storage units in which to store output of said counting circuitry.

53. The non-volatile event counter of claim 52 wherein said first non-volatile memory further comprises a plurality of second overlapping storage units and wherein said control circuitry is further operable to select one of said second overlapping storage units in which to store output of said counting circuitry.

54. The non-volatile event counter of claim 53 wherein said control circuitry is further operable to select one of said first and second overlapping storage units in which to store output of said counting circuitry.

55. The non-volatile event counter of claim 53 and further comprising a second non-volatile memory comprising a plurality of sequential bit storage locations and wherein said control circuitry is further operable to select one of said sequential bit storage locations in which to store a pointer indicating whether one of said second overlapping storage units stores a most recent output of said counting circuitry.

56. The non-volatile event counter of claim 53 and further comprising a second non-volatile memory comprising a shifter storage location operable to store a shifter value and wherein said control circuitry is further operable to input said shifter value to determine one of said second overlapping storage units in which to store output of said counting circuitry.

57. The non-volatile event counter of claim 56 and further comprising an adjuster for modifying said second shifter value.

58. The non-volatile event counter of claim 52 and further comprising a second non-volatile memory comprising a plurality of sequential bit storage locations and wherein said control circuitry is further operable to select one of said sequential bit storage locations in which to store a pointer indicating whether one of said first overlapping storage units stores a most recent output of said counting circuitry.

59. The non-volatile event counter of claim 52 and further comprising a second non-volatile memory comprising a shifter storage location operable to store a shifter value and wherein said control circuitry is further operable to input said shifter value to determine one of said first overlapping storage units in which to store output of said counting circuitry.

60. The non-volatile event counter of claim 59 and further comprising an adjuster for modifying said first shifter value.

61. An electronic odometer for indicating distance travelled comprising:
a distance increment detector operable to output a signal when a selected distance has been travelled;
a non-volatile event counter comprising:
counting circuitry operable to count occurrences of said signal;
a non-volatile memory comprising a plurality of overlapping storage units wherein at least some of said overlapping storage units have no data stored in at least a portion thereof at any given time; and
control circuitry operable to select one of said overlapping storage units in which to store output of said counting circuitry; and
said electronic odometer further comprising a display operable to display said output.

62. The odometer of claim 61 wherein said display is selected from the group consisting of light emitting diodes, gas plasma displays, vacuum florescent displays, and raster scan screens.

63. The odometer of claim 61 wherein said non-volatile memory comprises an EEPROM.

64. The odometer of claim 61 wherein said display comprises a liquid crystal display.

65. An apparatus for maintaining variable data in a non-volatile electronic memory device comprising:
a plurality of non-volatile bit storage locations:
a storage unit comprising a subset of adjacent bit storage locations of said plurality of non-volatile bit-storage locations, said subset including a first storage unit bit;
a shifter array for storing an address for said first storage unit bit; and
a column decoder with an input coupled to said shifter array, said column decoder for accessing said storage unit.

66. The apparatus of claim 65 wherein a shifter adjust signal indicates the occurrence of a specified number of transitions in said storage unit.

67. The apparatus of claim 65 wherein a shifter adjust signal indicates the storage of an incorrect data bit in said storage unit.

* * * * *